(12) United States Patent
Nagata

(10) Patent No.: US 8,192,899 B2
(45) Date of Patent: Jun. 5, 2012

(54) PELLICLE FOR PHOTOLITHOGRAPHY

(75) Inventor: Yoshihiko Nagata, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 173 days.

(21) Appl. No.: 12/656,207

(22) Filed: Jan. 21, 2010

(65) Prior Publication Data

US 2010/0190097 A1    Jul. 29, 2010

(30) Foreign Application Priority Data

Jan. 27, 2009 (JP) ................................ 2009-015390

(51) Int. Cl.
*G03F 1/64* (2012.01)
*G03F 1/62* (2012.01)

(52) U.S. Cl. .......................................................... 430/5

(58) Field of Classification Search ......... 430/5; 428/14
See application file for complete search history.

(56) References Cited

U.S. PATENT DOCUMENTS

2007/0037067 A1 * 2/2007 Wang ................................ 430/5
2007/0292775 A1 * 12/2007 Hamada ........................... 430/5

FOREIGN PATENT DOCUMENTS

JP    2005-250188    9/2005
JP    2006-003620    1/2006

* cited by examiner

*Primary Examiner* — Stephen Rosasco
(74) *Attorney, Agent, or Firm* — Manabu Kanesaka

(57) ABSTRACT

There is provided a pellicle for photolithography having a plurality of air vents formed in a pellicle frame for photolithography and having the air vents covered with a dustproof filter in which the air vents in the frame are counterbored and a counterbored wall surface of the air vents is tapered.

7 Claims, 9 Drawing Sheets

F I G. 2A
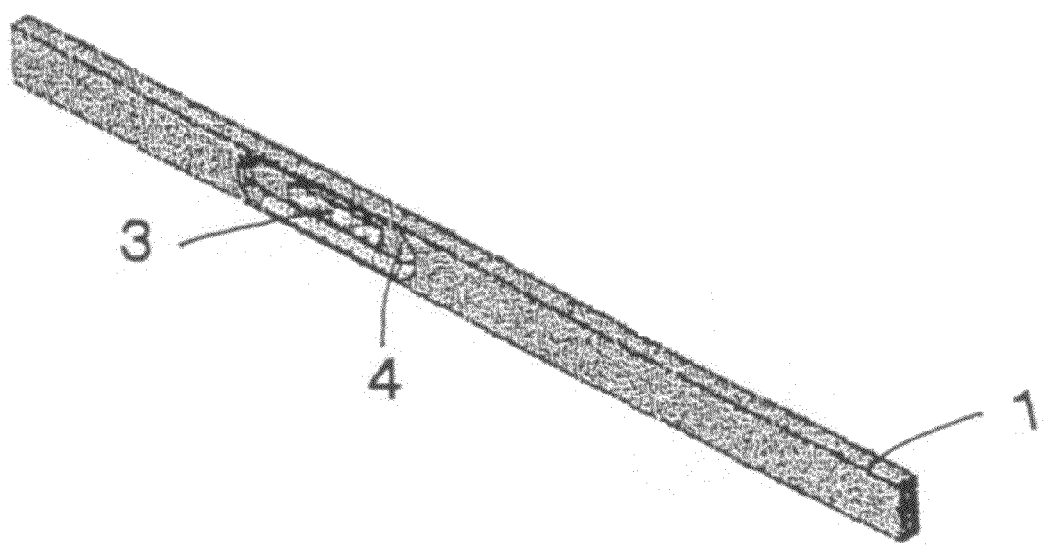

LONG SIDE

SHORT SIDE

LONG SIDE

SHORT SIDE

LONG SIDE 1

LONG SIDE 2

SHORT SIDE 1

SHORT SIDE 2

PELLICLE FOR PHOTOLITHOGRAPHY

FIELD OF THE INVENTION

The present invention relates to a pellicle for photolithography that is used as dustproof protection in manufacturing of semiconductor devices such as LSIs and ULSIs, or liquid crystal display panels.

BACKGROUND ART

In the manufacture of semiconductor devices such as LSIs and ULSIs, or liquid crystal display panels, and such, light is applied to a semiconductor wafer or a liquid crystal original panel to form a pattern; when dust is adhered to an exposure original plate (photolithography mask) used here, the dust absorbs or bends light, and thus the transferred pattern is deformed, the edge is made rough and the base is stained black, with the result that dimensions, quality, appearance and the like are disadvantageously degraded.

For this reason, these operations are generally performed in a clean room. However, since it is difficult to keep the exposure original plate clean all the time even within the clean room, a method of attaching a pellicle serving as a dustproof protection to the surface of the exposure original plate, which is obtained by adhering, to a pellicle frame, a pellicle film that highly transmits exposure light, is employed. In this case, dust is not directly adhered to the surface of the exposure original plate and is adhered to the pellicle film, and thus focusing on a pattern on the exposure original plate at the time of photolithography prevents the dust on the pellicle film from affecting the transfer.

A pellicle is basically configured as follows: a transparent pellicle film that is composed of materials highly transmitting exposure light such as nitrocellulose, cellulose acetate, fluorine polymer and other components is adhered by air drying to the upper portion of a pellicle frame composed of an aluminum alloy, such as A7075, A6061 or A5052, that is black alumite treated, a stainless steel, polyethylene and other components, to which a good solvent for a pellicle film is applied (see patent document 1), or is adhered with an adhesive such as an acrylic resin, an epoxy resin or a fluorine resin (see patent documents 2 and 3); furthermore, in order for the exposure original plate to be fitted to the bottom portion of the pellicle frame, an adhesion layer is provided that is composed of a polybutene resin, a polyvinyl acetate resin, an acrylic resin, a silicone resin or other resins; and a reticle adhesive protective liner for the purpose of protecting the pressure-sensitive adhesion layer is provided.

When the pellicle is adhered to the exposure original plate, a closed space is formed inside the pellicle. In this case, the pellicle film does not have air permeability, and thus the gas within the closed space expands and contracts as the temperature varies, with the result that the pellicle film swells upward or hangs downward. To prevent this, a pellicle is known in which air vents are formed in a pellicle frame (see patent document 4). As shown in FIG. 8, patent document 4 discloses a pellicle that is provided with: pellicle frame sides 12 in which air vents 11 are formed; and pellicle frame sides 13 applied an adhesive 14 which collects dust existing, entering and occurring in the closed space of the pellicle.

There is also an example of a pellicle in which no adhesive is used therewithin and air vents 11 are formed in a pellicle frame 12 with a filter 15 (see FIG. 9).

However, a pellicle that simply includes one or a plurality of air vents has poor ventilation efficiency, and, unless significant variations in air pressure within the closed space of the pellicle, for example, significant variations in air pressure under mask environments resulting from exposure, are produced, desired ventilation is not performed. When, in a photolithography process, ultraviolet rays (an i-line or a g-line, a KrF, laser beam, an ArF laser beam, a $F_2$ laser beam or the like) are applied, exposure is performed or a photomask is stored, an organic or inorganic gas generated from the constituent components of the pellicle is released from the constituent components of the pellicle, is formed as a gaseous substance and is left within the closed space formed by the pellicle and the photomask; the gas photochemically reacts with ammonia or a cyanogen compound or other hydrocarbon compounds present in the environment under application of ultraviolet rays at the time of exposure to form a fog called a haze such as ammonium sulfate or fine particles; and it is difficult for the above-mentioned pellicle to cope with this situations.

Citation List

Patent Documents

[Patent document 1] JP-A-S58-219023

[Patent document 2] U.S. Pat. No. 4,86,1402

[Patent document 3] JP-B-S63-27707

[Patent document 4] JP-A-H3-166545

A pellicle is arranged so as to cover a pattern region formed on the surface of a mask substrate. Since the pellicle is provided to prevent the adherence of dust onto the mask substrate, the pattern region is isolated from the outer portion of the pellicle such that the dust on the outer portion of the pellicle is not adhered to the surface of the pattern.

In recent years, the design rule of LSIs has become finer into a sub-quarter micrometer order, and the wavelength of an exposure light source has become narrower accordingly, and specifically, the wavelength changes from a g-line (436 nm) and an i-line (365 nm) by a mercury lamp, which are conventionally used, to a KrF excimer laser beam (248 nm), an ArF excimer laser beam (193 nm), a $F_2$ laser beam (157 nm) and the like. As the wavelength of exposure light becomes narrower as described above, the exposure light naturally has higher energy. When high-energy light is used, as compared with the light of conventional wavelength, it is highly likely that gaseous substances existing in an exposure atmosphere react to produce reactive products on the mask substrate.

To overcome this problem, attempts have been made to minimize gaseous substances within a clean room, to clean a reticle more carefully, to remove gas-generating substances from the constituent components of the pellicle and to take other measures. Since the pellicle, in particular, is used by being directly attached to a mask substrate, it has been required to reduce the production of gas from the constituent materials of the pellicle, namely, a reticle adhesive, a pellicle film adhesive, an inner wall coating agent or the like formed of organic material, and improvements have been made. However, the production of a fog-like foreign material called a haze on the mask substrate is not completely prevented even when the reticle is cleaned and the production of gas from the constituent materials of the pellicle is reduced, with the result that it is responsible for reduced yields in the manufacture of semiconductor.

SUMMARY OF INVENTION

Technical Problem

In view of the foregoing, the present invention has an object to minimize a problem-causing substance from the inner space of a pellicle when light is exposed to the closed space between the pellicle and a mask.

Solution to Problem

The inventors of the present invention have thoroughly studied to achieve the object and have found that a gas produced from the constituent components of the pellicle is released from the members of the pellicle under conditions of exposure and is left within the closed space between the pellicle and the mask, and that the application of short wavelength ultraviolet rays to the gas at the time of exposure may cause a haze such as ammonium sulfate and hydrocarbon compound.

Then, the inventors have invented a pellicle in which a gas produced from the constituent components of the pellicle and the like is unlikely to be left within the inner space of the pellicle and completed the pellicle in which the production of a haze is reduced even under conditions of exposure of short wavelength ultraviolet light.

According to one aspect of the present invention, there is provided a pellicle for photolithography having a plurality of air vents which are covered with a dustproof filter, and the air vents in the frame are counterbored and a counterbored wall surface of the air vents is tapered. Here, at least one counterbored air vent can be provided in each side of the frame; the angle of an inclined tapered surface can be more than 90 degrees but less than 180 degrees with respect to a vertical direction to a surface of the frame; the counterbored portion can be circular, oval, or rectangular; and the plurality of air vents can be conterbored.

Advantageous Effects of Invention

In the present invention, the air vents provided in the outside surface of the pellicle frame and the filters covering this are arranged on the bottom of the recess portion provided by counterboring the outside surface of the pellicle frame, and the wall surface of the recess portion is tapered. Thus, it is possible to effectively introduce an outside air and discharge it by moving along the stage of a stepper or a scanner at a high speed, with the result that, as shown in FIG. 7, air that is left within the closed space in the pellicle is effectively discharged such that the air is unlikely to be left inside. For this reason, a haze is unlikely to be produced on the mask, and thus it is possible to utilize the present invention for the photolithography using light of a shorter wave length.

BRIEF DESCRIPTION OF DRAWINGS

FIG. 2A is a perspective diagram showing an example of an oval counterbored portion provided around air vents of a pellicle frame of the present invention.

DESCRIPTION OF EMBODIMENTS

According to the present invention, there is provided a pellicle for photolithography that includes a pellicle frame having a mechanism of ventilating the inside of the pellicle in a passive manner.

The present invention will be described below in further detail with reference to the accompanying drawings.

As in a typical pellicle, basically, in the pellicle of the present invention, a pellicle film is adhered to the upper end surface of a pellicle frame through a pellicle film attachment adhesive; in this case, a reticle adhesion adhesive is generally formed on the lower end surface, and a liner is removably adhered to the lower end surface of the reticle adhesion adhesive.

In this case, these constituent components of the pellicle are similar in size to those of a typical pellicle such as a pellicle for semiconductor photolithography or a pellicle for a large liquid crystal display panel manufacture photolithography process, and, as the materials thereof, known materials such as the above-mentioned materials can be used. More specifically, in this point, the type of pellicle film is not particularly limited, and, for example, an amorphous fluorine polymer or the like that is conventionally used for an excimer laser can be used. Examples of the amorphous fluorine polymer include "Cytop" (the trade name of the product made by "Asahi Glass Co., Ltd.") and "Teflon AF" (the trade name of the product made by "DuPont Co., Ltd."). When the pellicle film is made, these polymers may be dissolved in a solvent as required and used; for example, they can be dissolved in a fluorine solvent or the like as appropriate.

As the base material of the pellicle frame used in the present invention, a conventionally used aluminum alloy material, preferably JIS A7075, JIS A6061, JIS A5052, or the like is used; however, resin, glass or the like other than the aluminum alloy material may be used without any particular limitation as long as the strength of the pellicle frame is maintained.

The pellicle of the present invention is characterized in that air vents are formed in the pellicle frame, filters are placed in the air vents and counterbored portions are formed in the vicinity of locations where the filters are placed. A typical example of the pellicle is shown in FIG. 1.

Figure 1:
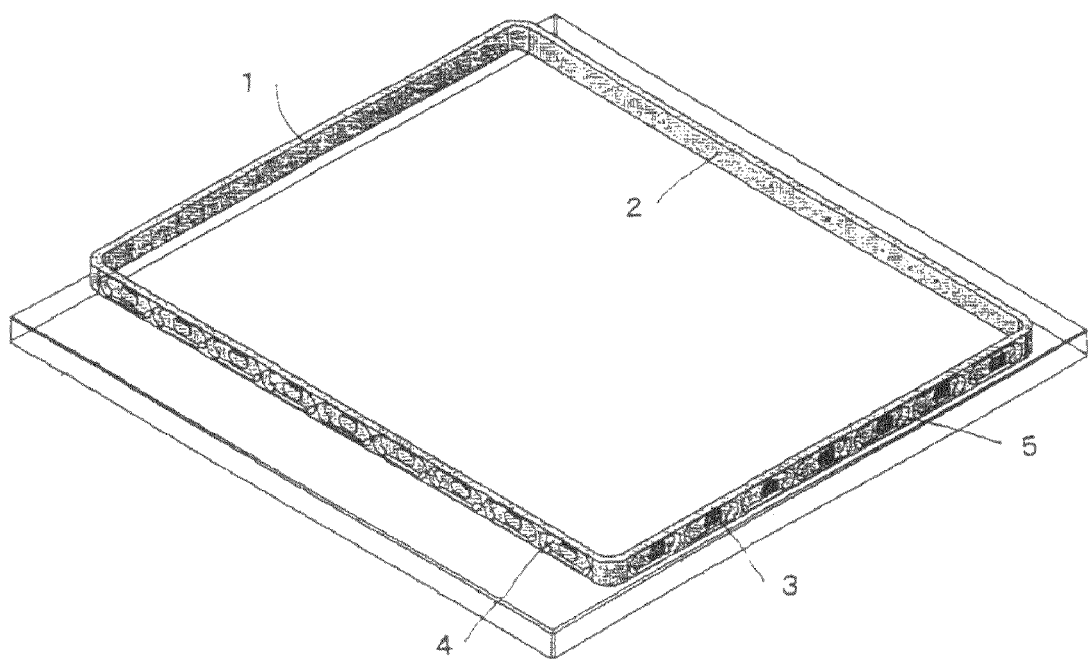
FIG. 1 is a diagram showing an example of a pellicle of the present invention.

In FIG. 1, the reference numeral 1 represents the pellicle frame; in the pellicle frame 1, the air vent 2 is formed, and the dustproof filter 3 covers the air vent 2. In the outside portion of the pellicle frame 1, counterbore processed portions 4 are provided.

Figure 2B:
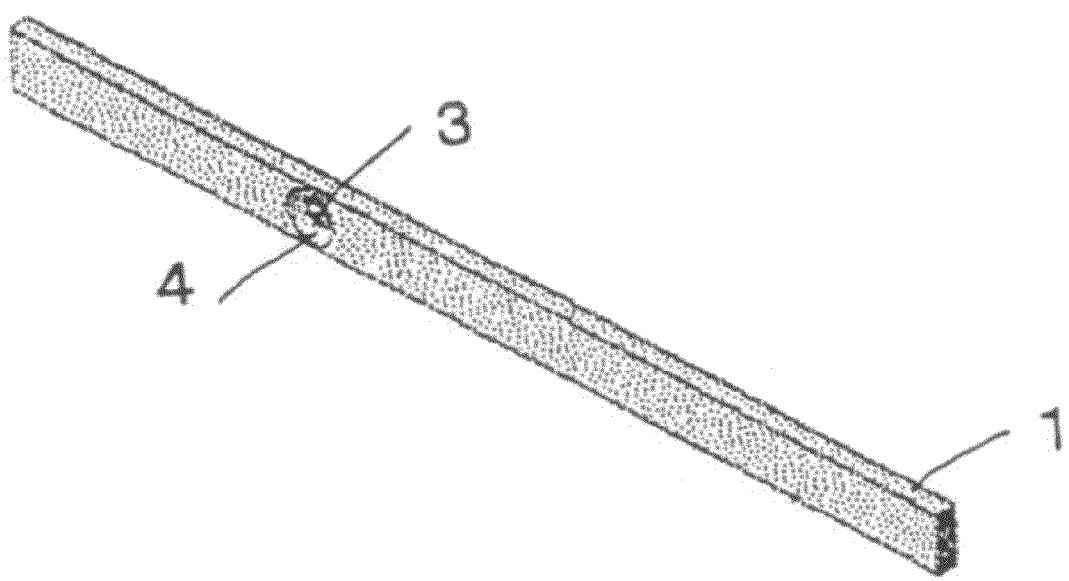
FIG. 2B is a perspective diagram showing an example of a circular counterbored portion provided around air vents of a pellicle frame of the present invention.
Figure 2C:
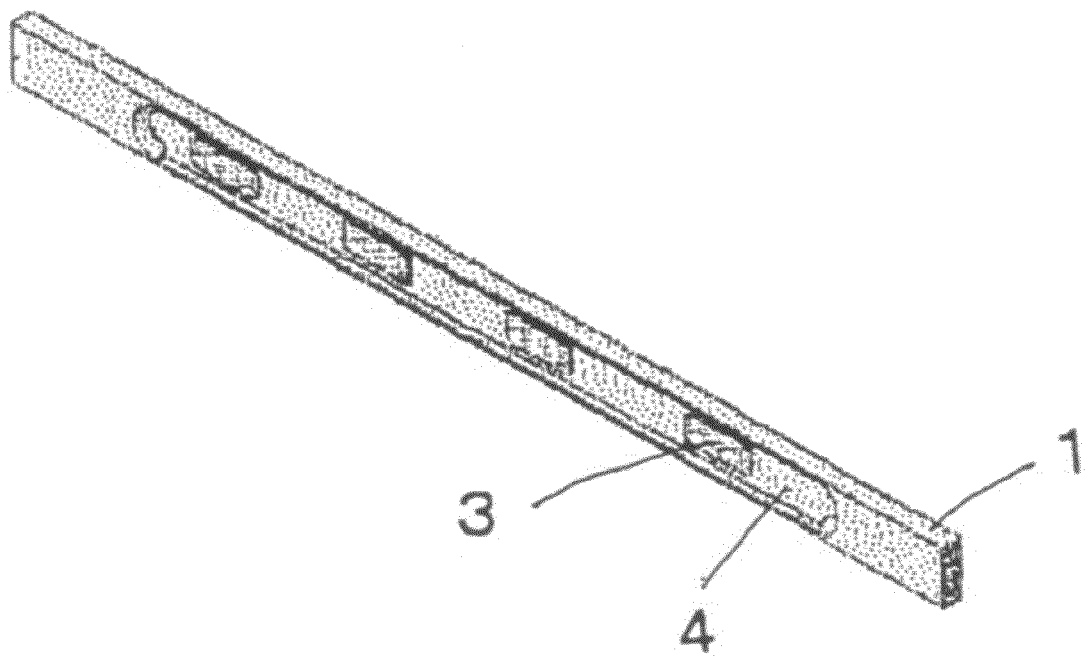
FIG. 2C is a perspective diagram showing an example of a "continuous shape" including a plurality of air vents 2 together.

The size of counterbore processed portion located in the portion where the air vent is formed is not particularly limited as long as; it is larger in hole size than the air vent; it is dug deeper than the thickness of the filter; it does not exceed the thickness of the pellicle frame, but the angle of the wall surface of the counterbore processed portion needs to be larger than 90°. If the angle is smaller than 90°, the useful air vent is blocked; on the other hand, if the angle is set to be larger, it becomes possible to increase the amount of an external air that flows into the air vent. However, if the angle is set to be more than 180°, an air current is disturbed, and thus, it becomes difficult to have its advantage. The outside shape of the counterbore processed portion is not limited as long as the external air can be efficiently introduced; for example, the counterbore processed portion may be formed in the shape of an oval (FIG. 2A), a circle (FIG. 2B), a rectangular or a "continuous shape" (FIG. 2C) including a plurality of air vents 2 together.

Figure 3:
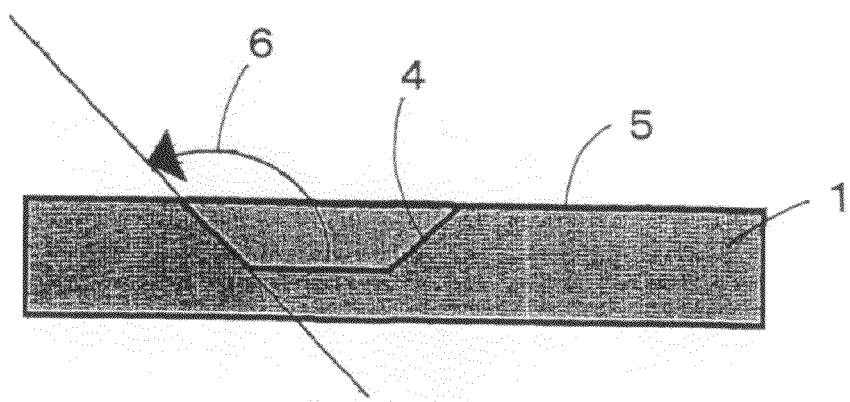
FIG. 3 is a diagram showing the definition of a taper angle of the counterbored portion of the present invention.

As shown in FIG. 3, an outwardly diverging counterbore 4 is formed and if the angle of divergence is defined by the angle indicated by an arrow 6, the counterbore has an angle of divergence which exceeds 90° but is less than 180°.

In each of four side surfaces (four sides) of the pellicle frame, at least one counterbored air vent is formed. The size and shape of the air vent are not particularly limited; the size and shape are selected according to the mesh size of the filter placed in the air vent, a filtration area or the amount of ventilation air determined from these. Since the purpose of the air vents is that the inside and outside of the pellicle are ventilated and that dirty air is prevented from being left within the pellicle, the air vents are preferably arranged such that the inside of the pellicle is ventilated as fully as possible.

As an example of the arrangement, the air vents are preferably provided in portions close to the four corners of the pellicle frame, in the vicinity of the center of the frame and in other locations. In consideration of exposure conditions, usage hours, cost and the like, the number of air vents that are provided in the pellicle frame may be varied as appropriate.

Check experiments were performed to check the relationship between the number and arrangement of air vents in the four sides of the pellicle frame and the production of a haze, and the results shown in Table 1 were obtained.

Specifically, the pellicle frame having outer dimensions of 149 mm×122 mm×5.8 mm and a frame thickness of 2 mm and formed of an aluminum alloy A7075-T651 was used; the same number of air vents and the different number of air vents are each used both in the opposite long sides and the short sides, and the same number of air vents and the different number of air vents are each used in the long and short sides. By setting various combinations of these, the check experiments were performed to check the "production of a haze" at an exposure amount of 500 J/cm$^2$ with an ArF excimer laser. The "production of a haze" was checked with a laser scattering foreign matter inspection device.

Figure 4:
FIG. 4 is a diagram showing an example of arrangement of the air vents provided in the pellicle frame of the present invention.
Figure 4:
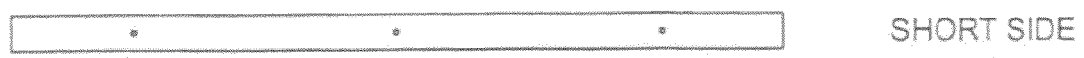
Figure 5:
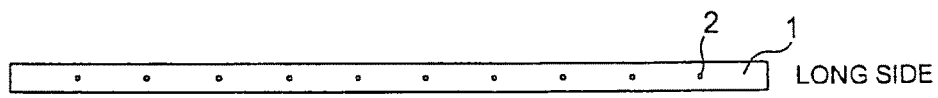
FIG. 5 is a diagram showing another example of arrangement of the air vents provided in the pellicle frame of the present invention.
Figure 5:
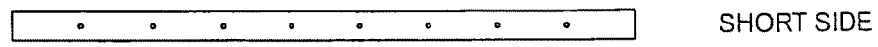
Figure 6:
FIG. 6 is a diagram showing yet another example of arrangement of the air vents provided in the pellicle frame of the present invention.
Figure 6:
Figure 6:
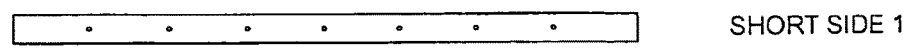
Figure 6:
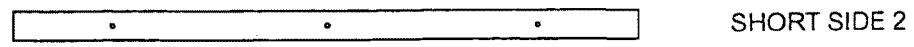
Figure 7:
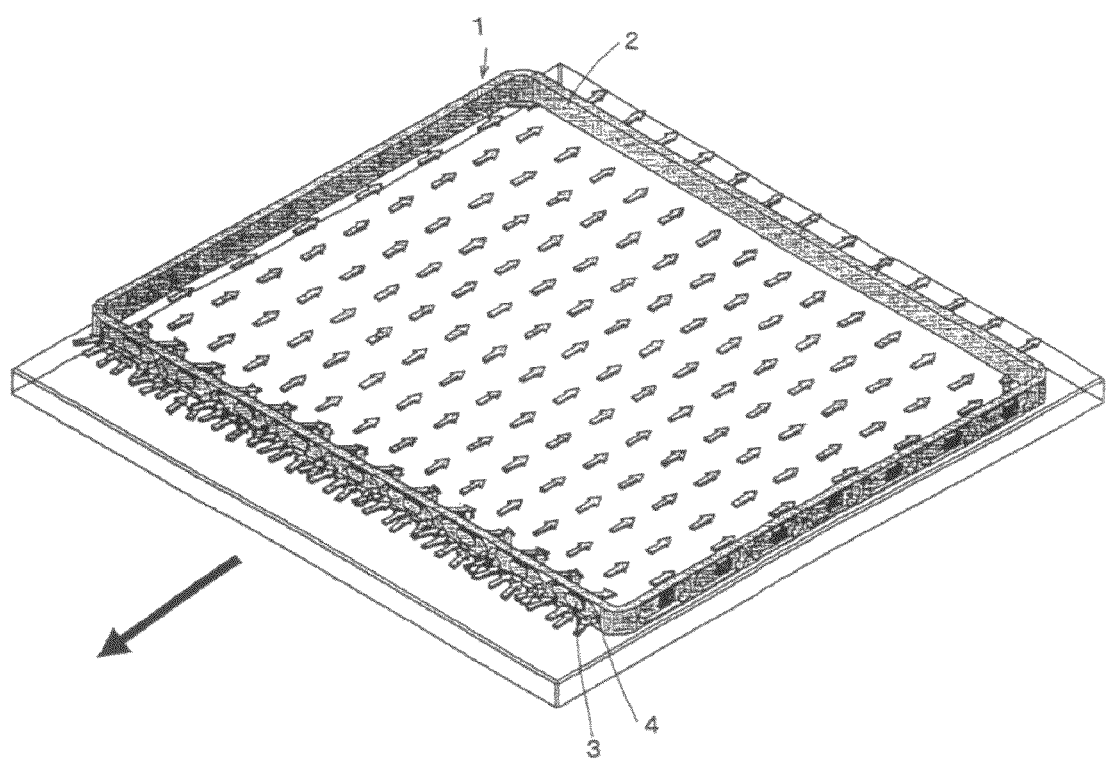
FIG. 7 is a diagram showing an example in which an external air within the pellicle adhered to a mask substrate flows into and out of the pellicle when the pellicle moves along the stage of a scanner.
Figure 8:
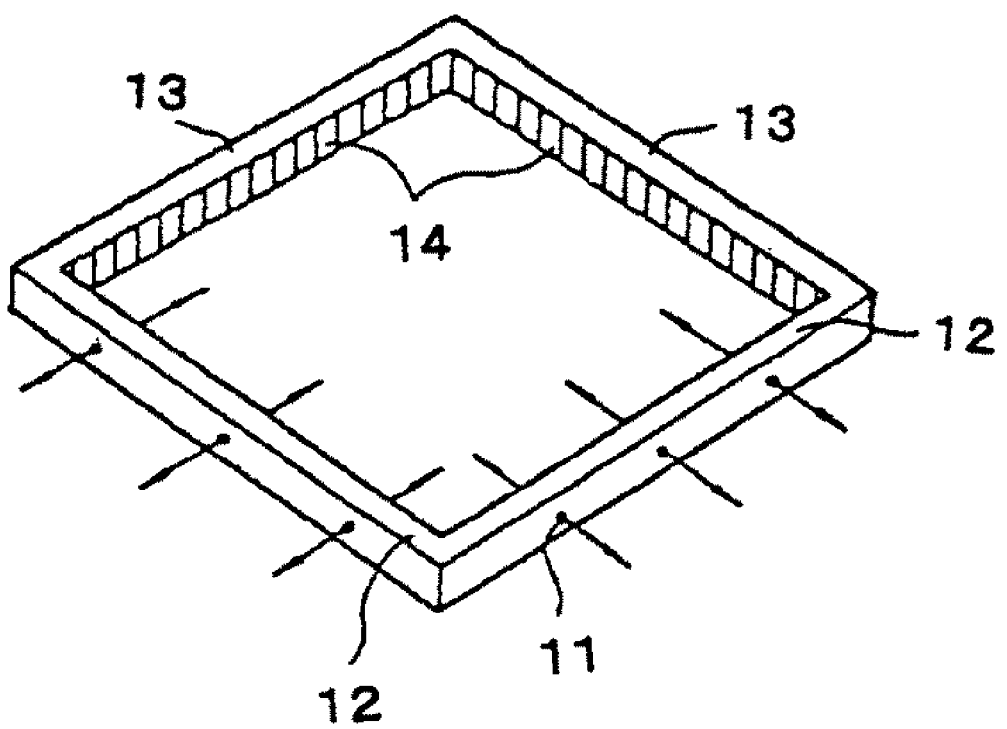
FIG. 8 is a diagram showing an example of a conventional pellicle provided with air vents and an adhesive layer.
Figure 9:
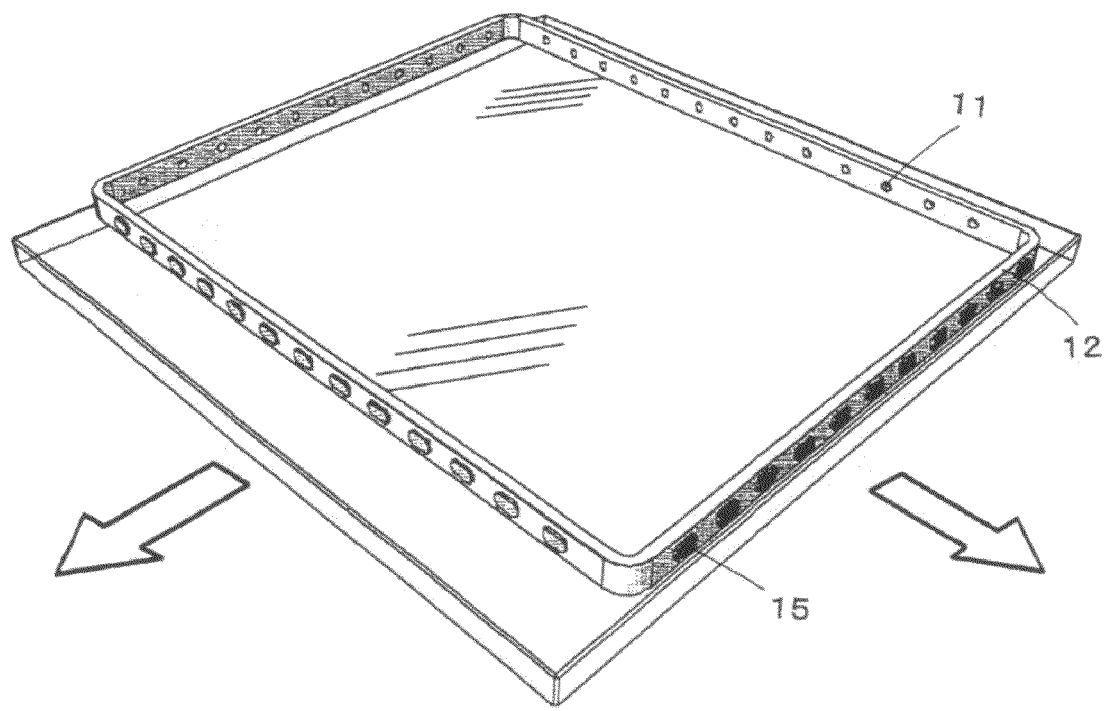
FIG. 9 is a diagram showing an example of a conventional pellicle in which a pellicle frame is provided with air vents.

Several examples of the arrangement of the air vents in the pellicle frame are shown in FIGS. 4 to 6.

FIG. 4 shows an example in which, as the pellicle frame, a frame having outer dimensions of 149 mm×122 mm×5.8 mm and a frame thickness of 2 mm and formed of the aluminum alloy A7075-T651 was prepared, and in which the air vents with a diameter of 0.5 mm were provided both at the center (a total of four locations) of each side surface of the frame and at positions (a total of eight locations; the grand total of twelve locations) 20 mm away from the corners of each side surface.

FIG. 5 shows an example in which the air vents with a diameter of 0.5 mm were provided both at 10 locations in the side surfaces of each long side of the frame and at 8 locations in the side surfaces of each short side, that is, at a total of 36 locations.

FIG. 6 shows an example in which the opposite sides with respect to both the long side and the short side each had the different number of air vents, and specifically, the ratio of long side 1 to long side 2 was 9 to 3 whereas the ratio of short side 1 to short side 2 was 7 to 3.

With respect to typical check experiments of several experiment numbers, their conditions will be described. The conditions of other experiment numbers correspond to those described below.

[Experiment Number 6]

First, as the pellicle frame, a frame having outer dimensions of 149 mm×122 mm×5.8 mm and a frame thickness of 2 mm and formed of the aluminum alloy A7075-T651 was prepared. The air vents with a diameter of 0.5 mm were provided at 4 locations in the center of one side surface of the frame and at 8 locations 20 mm away from the corners thereof, that is, at a total of 12 locations. Then, at each center of the air vents at these 12 locations, a counterbored portion 10 mm wide, 5 mm high and 1 mm deep and tapered at a wall angle of 135° was provided.

The surface of the pellicle frame was washed, and was then subjected to surface treatment for one minute with a sandblast device using glass beads at a discharge pressure of about 137.1 kPa (1.5 kg/cm$^2$), with the result that the surface was made rough. Thereafter, the pellicle frame was washed by being immersed in NaOH solution for ten seconds, and then was anodized at a formation voltage of 10V (1.3 A) in 14% sulfuric acid aqueous solution at a temperature of 18° C. Then, it was dyed black and the holes were sealed, with the result that a black oxide layer was formed on the surface. Thereafter, it was washed for five minutes with ultrapure water and an ultrasonic washing device.

Then, a silicone adhesive of 10 μm was coated on the inner surface of the frame with a spray coating device. Thereafter, in the air vent, the filter was placed that was formed of PTFE, that filtered dust having a size of 0.1 to 3.0 μm at 99.9999% and that had a width of 8 mm, a height of 2.5 mm and a thickness of 300 μm. The filter was configured such that a dust filter was provided.

Then, "Teflon AF1600" (the trade name of the product made by "DuPont U.S.") was dissolved in a fluorine solvent named "Fluorinert FC-75" (the trade name of the product made by "3M Company, U.S."), and thus the 8% solution was prepared.

Then, with this solution, a transparent film of 0.8 μm was formed by a spin coater on the surface of a mirror polished silicon substrate 200 mm in diameter and 600 μm in thickness.

Then, the frame having outer dimensions of 200 mm×200 mm×5 mm wide and 5 mm thick was bonded to this film with an epoxy adhesive named "Araldite Rapid" (the trade name of the product made by "Showa High Polymer Co., Ltd."), and was peeled off the silicon substrate.

Then, a silicone adhesive was applied to one end surface of the aluminum alloy frame prepared as described above, and it was dried and cured by being heated at a temperature of 100° C. for 10 minutes. A fluorine high polymer named "CTX" (the trade name of the product made by "Asahi Glass Co., Ltd.") diluted in a fluorine solvent "CT—SOLVE 180" (the trade name of the product made by "Asahi Glass Co., Ltd.") was applied onto the other end surface of the aluminum alloy frame, and it was dried and cured by being heated at a temperature of 100° C. for 10 minutes.

A PET liner was prepared, and was pasted to a reticle adhesive with a liner pasting device having an image processing locating mechanism using a CCD camera.

Then, the frame was made to come in intimate contact with the surface of the film of "Teflon AF1600" (the trade name of the product made by "DuPont U.S."), and thereafter the frame was heated by an IR lamp, with the result that the frame and the film were fused to each other. The two frames were fitted and fixed to a jig fixture with the adhesion surface of the pellicle frame facing upward.

Then, the outside frame of the pellicle frame was raised and fixed, and thus a tension of about 490 Pa (0.5 kg/cm$^2$) was applied to the film portion on the outside of the pellicle frame.

Then, unwanted film sections outside the pellicle frame were cut and removed using a tube-type dispenser on a cutter mounted on a SCARA robot while moving the cutter along the periphery of the adhesive section of the pellicle frame and dropping "Fluorinert FC-75" (the trade name of the product made by "DuPont") at 10 micro liter per minute.

The complete pellicle was attached to a six-inch photomask made of quartz glass which was washed such that the concentration of a surface residual acid component was equal to or less than 1 ppb and on which a Cr test pattern was formed. Then, it was fitted to an ArF excimer laser scanner named "NSR S306C" (the trade name of the product made by "Nikon Corporation"), and a laser beam was applied thereto up to 500 J/cm$^2$ at a reticle surface exposure strength of 0.01 mJ/cm$^2$/pulse at a cyclic frequency of 4000 Hz.

The contamination condition of the surface of the laser beam applied six-inch photomask was observed with a laser foreign matter inspection device, with the result that no haze and foreign matter were observed on the test pattern portion and a glass portion.

[Experiment Number 7]

First, as the pellicle frame, a frame having outer dimensions of 149 mm×122 mm×5.8 mm and a frame thickness of 2 mm and formed of the aluminum alloy A7075-T651 was prepared. The air vents with a diameter of 0.5 mm were provided at 10 locations in the side surface of a long side of the frame and 8 locations in a short side thereof, that is, at a total of 36 locations. Then, in the long side and the short side including the air vents at these 36 locations, counterbored portions 139 mm wide and 5 mm high and tapered at a wall angle of 135° and counterbored portions 110 mm wide and 5 mm high and tapered at a wall angle of 135°, respectively, were provided.

The surface of the pellicle frame was washed, and was then subjected to surface treatment for one minute with a sandblast device using glass beads at a discharge pressure of about 137.1 kPa (1.5 kg/cm$^2$), with the result that the surface was made rough. Thereafter, the pellicle frame was washed by being immersed in NaOH solution for ten seconds, and then was anodized at a formation voltage of 10V (1.3 A) in 14% sulfuric acid aqueous solution at a temperature of 18° C. Then, it was dyed black and the holes were sealed, with the result that a black oxide layer was formed on the surface. Thereafter, it was washed for five minutes with ultrapure water and an ultrasonic washing device.

Then, a silicone adhesive of 10 μm was coated on the inner surface of the frame with a spray coating device. Thereafter, in the air vent, the filter was placed that was formed of PTFE, that filtered dust having a size of 0.1 to 3.0 μm at 99.9999% and that had a width of 8 mm, a height of 2.5 mm and a thickness of 300 μm. The filter was configured such that a dust filter portion and a chemical filter outside it were provided.

Then, "Teflon AF1600" (the trade name of the product made by "DuPont U.S.") was dissolved in a fluorine solvent named "Fluorinert FC-75" (the trade name of the product made by "3M Company, U.S."), and thus the 8% solution was prepared.

Then, with this solution, a transparent film of 0.8 μm was formed by a spin coater on the surface of a mirror polished silicon substrate 200 mm in diameter and 600 μm in thickness.

Then, the frame having outer dimensions of 200 mm×200 mm×5 mm wide and 5 mm thick was bonded to this film with an epoxy adhesive named "Araldite Rapid" (the trade name of the product made by "Showa High Polymer Co., Ltd."), and was peeled off the silicon substrate.

Then, a silicone adhesive was applied to one end surface of the aluminum alloy frame prepared as described above, and it was dried and cured by being heated at a temperature of 100° C. for 10 minutes. A fluorine high polymer named "CTX" (the trade name of the product made by "Asahi Glass Co., Ltd.") diluted in a fluorine solvent "CT—SOLVE 180" (the trade name of the product made by "Asahi Glass Co., Ltd.") was applied onto the other end surface of the aluminum alloy frame, and it was dried and cured by being heated at a temperature of 100° C. for 10 minutes.

A PET liner was prepared, and was pasted to a reticle adhesive with a liner pasting device having an image processing locating mechanism using a CCD camera.

Then, the frame was made to come in intimate contact with the surface of the film of "Teflon AF1600" (the trade name of the product made by "DuPont U.S."), and thereafter the frame was heated by an IR lamp, with the result that the frame and the film were fused to each other. The two frames were fitted and fixed to a jig fixture with the adhesion surface of the pellicle frame facing upward.

Then, the outside frame of the pellicle frame was raised and fixed, and thus a tension of about 490 Pa (0.5 kg/cm$^2$) was applied to the film portion on the outside of the pellicle frame.

Then, unwanted film sections outside the pellicle frame were cut and removed using a tube-type dispenser on a cutter mounted on a SCARA robot while moving the cutter along the periphery of the adhesive section of the pellicle frame and dropping "Fluorinert FC-75" (the trade name of the product made by "DuPont") at 10 micro liter per minute.

The complete pellicle was attached to a six-inch photomask made of quartz glass which was washed such that the concentration of a surface residual acid component was equal to or less than 1 ppb and on which a Cr test pattern was formed. Then, it was fitted to an ArF excimer laser scanner named "NSR S306C" (the trade name of the product made by "Nikon Corporation"), and a laser beam was applied thereto up to 500 J/cm$^2$ at a reticle surface exposure strength of 0.01 mJ/cm$^2$/pulse at a cyclic frequency of 4000 Hz.

The contamination condition of the surface of the laser beam applied six-inch photomask was observed with a laser foreign matter inspection device, with the result that no haze and foreign matter were observed on the test pattern portion and a glass portion.

[Experiment Number 12]

First, as the pellicle frame, a frame having outer dimensions of 149 mm×122 mm×5.8 mm and a frame thickness of 2 mm and formed of the aluminum alloy A7075-T651 was prepared. The air vent with a diameter of 0.5 mm was provided in the center of one side surface of the frame.

The surface of the pellicle frame was washed, and was then subjected to surface treatment for one minute with a sandblast device using glass beads at a discharge pressure of about 137.1 kPa (1.5 kg/cm$^2$), with the result that the surface was made rough. Thereafter, the pellicle frame was washed by being immersed in NaOH solution for ten seconds, and then was anodized at a formation voltage of 10V (1.3 A) in 14% sulfuric acid aqueous solution at a temperature of 18° C. Then, it was dyed black and the hole was sealed, with the result that a black oxide layer was formed on the surface. Thereafter, it was washed for five minutes with ultrapure water and an ultrasonic washing device.

Then, a silicone adhesive of 1 μm was coated on the inner surface of the frame with a spray coating device.

Thereafter, in the air vent, the filter was placed that was formed of PTFE, that filtered dust having a size of 0.1 to 3.0 μm at 99.9999% and that had a width of 9.5 mm, a height of 2.5 mm and a thickness of 300 μm. The filter was configured such that a dust filter portion and a chemical portion outside it were provided.

Then, "Teflon AF1600" (the trade name of the product made by "DuPont U.S.") was dissolved in a fluorine solvent named "Fluorinert FC-75" (the trade name of the product made by "3M Company, U.S."), and thus the 8% solution was prepared.

Then, with this solution, a transparent film of 0.8 μm was formed by a spin coater on the surface of a mirror polished silicon substrate 200 mm in diameter and 600 μm in thickness.

Then, the frame having outer dimensions of 200 mm×200 mm×5 mm wide and 5 mm thick was bonded to this film with an epoxy adhesive named "Araldite Rapid" (the trade name of the product made by "Showa High Polymer Co., Ltd."), and was peeled off the silicon substrate.

Then, a silicone adhesive was applied to one end surface of the aluminum alloy frame prepared as described above, and it was dried and cured by being heated at a temperature of 100° C. for 10 minutes. A fluorine high polymer named "CTX" (the trade name of the product made by "Asahi Glass Co., Ltd.") diluted in a fluorine solvent "CT—SOLVE 180" (the trade name of the product made by "Asahi Glass Co., Ltd.") was applied onto the other end surface of the aluminum alloy frame, and it was dried and cured by being heated at a temperature of 100° C. for 10 minutes.

A PET liner was prepared, and was pasted to a reticle adhesive with a liner pasting device having an image processing locating mechanism using a CCD camera.

Then, the frame was made to come in intimate contact with the surface of the film of "Teflon AF1600" (the trade name of the product made by "DuPont U.S."), and thereafter the frame was heated by an IR lamp, with the result that the frame and the film were fused to each other. The two frames were fitted and fixed to a jig fixture with the adhesion surface of the pellicle frame facing upward.

Then, the outside frame of the pellicle frame was raised and fixed, and thus a tension of about 490 Pa (0.5 kg/cm$^2$) was applied to the film portion on the outside of the pellicle frame.

Then, unwanted film sections outside the pellicle frame were cut and removed using a tube-type dispenser on a cutter mounted on a SCARA robot while moving the cutter along the periphery of the adhesive-section of the pellicle frame and dropping "Fluorinert FC-75" (the trade name of the product made by "DuPont") at 10 micro liter per minute.

The complete pellicle was attached to a six-inch photomask made of quartz glass which was washed such that the concentration of a surface residual acid component was equal to or less than 1 ppb and on which a Cr test pattern was formed. Then, it was fitted to an ArF excimer laser scanner named "NSR S306C" (the trade name of the product made by "Nikon Corporation"), and a laser beam was applied thereto up to 500 J/cm$^2$ at a reticle surface exposure strength of 0.01 mJ/cm$^2$/pulse at a cyclic frequency of 4000 Hz.

The contamination condition of the surface of the laser beam applied six-inch photomask was observed with a laser foreign matter inspection device, with the result that no haze and foreign matter were observed on the test pattern portion but a haze was observed on a glass portion. It was analyzed with a laser Raman spectrophotometer, and was found to be ammonium sulfate.

[Experiment Number 13]

First, as the pellicle frame, a frame having outer dimensions of 149 mm×122 mm×5.8 mm and a frame thickness of 2 mm and formed of the aluminum alloy A7075-T651 was prepared. The air vents with a diameter of 0.5 mm were provided at 4 locations in the center of one side surface of the frame and at 8 locations 20 mm away from the corners thereof, that is, at a total of 12 locations. Then, at each center of the air vents at these 12 locations, a counterbored portion 10 mm wide, 5 mm high and 1 mm deep and tapered at a wall angle of 90° was provided.

The surface of the pellicle frame was washed, and was then subjected to surface treatment for one minute with a sandblast device using glass beads at a discharge pressure of about 137.1 kPa (1.5 kg/cm$^2$), with the result that the surface was made rough. Thereafter, the pellicle frame was washed by being immersed in NaOH solution for ten seconds, and then was anodized at a formation voltage of 10V (1.3 A) in 14% sulfuric acid aqueous solution at a temperature of 18° C. Then, it was dyed black and the holes were sealed, with the result that a black oxide layer was formed on the surface. Thereafter, it was washed for five minutes with ultrapure water and an ultrasonic washing device.

Then, a silicone adhesive of 10 μm was coated on the inner surface of the frame with a spray coating device.

Thereafter, in the air vent, the filter was placed that was formed of PTFE, that filtered dust having a size of 0.1 to 3.0 μm at 99.9999% and that had a width of 8 mm, a height of 2.5 mm and a thickness of 300 μm. The filter was configured such that a dust filter portion and a chemical filter outside it were provided.

Then, "Teflon AF1600" (the trade name of the product made by "DuPont U.S.") was dissolved in a fluorine solvent named "Fluorinert FC-75" (the trade name of the product made by "3M Company, U.S."), and thus the 8% solution was prepared.

Then, with this solution, a transparent film of 0.8 μm was formed by a spin coater on the surface of a mirror polished silicon substrate 200 mm in diameter and 600 μm in thickness.

Then, the frame having outer dimensions of 200 mm×200 mm×5 mm wide and 5 mm thick was bonded to this film with an epoxy adhesive named "Araldite Rapid" (the trade name of the product made by "Showa High Polymer Co., Ltd."), and was peeled off the silicon substrate.

Then, a silicone adhesive was applied to one end surface of the aluminum alloy frame prepared as described above, and it was dried and cured by being heated at a temperature of 100° C. for 10 minutes. A fluorine high polymer named "CTX" (the trade name of the product made by "Asahi Glass Co., Ltd.") diluted in a fluorine solvent "CT—SOLVE 180" (the trade name of the product made by "Asahi Glass Co., Ltd.") was applied onto the other end surface of the aluminum alloy frame, and it was dried and cured by being heated at a temperature of 100° C. for 10 minutes.

A PET liner was prepared, and was pasted to a reticle adhesive with a liner pasting device having an image processing locating mechanism using a CCD camera.

Then, the frame was made to come in intimate contact with the surface of the film of "Teflon AF1600" (the trade name of the product made by "DuPont U.S."), and thereafter the frame was heated by an IR lamp, with the result that the frame and the film were fused to each other. The two frames were fitted and fixed to a jig fixture with the adhesion surface of the pellicle frame facing upward.

Then, the outside frame of the pellicle frame was raised and fixed, and thus a tension of about 490 Pa (0.5 kg/cm$^2$) was applied to the film portion on the outside of the pellicle frame.

Then, unwanted film sections outside the pellicle frame were cut and removed using a tube-type dispenser on a cutter mounted on a SCARA robot while moving the cutter along the periphery of the adhesive section of the pellicle frame and dropping "Fluorinert FC-75" (the trade name of the product made by "DuPont") at 10 micro liter per minute.

The complete pellicle was attached to a six-inch photomask made of quartz glass which was washed such that the concentration of a surface residual acid component was equal to or less than 1 ppb and on which a Cr test pattern was formed. Then, it was fitted to an ArF excimer laser scanner named "NSR S306C" (the trade name of the product made by "Nikon Corporation"), and a laser beam was applied thereto up to 500 J/cm$^2$ at a reticle surface exposure strength of 0.01 mJ/cm$^2$/pulse at a cyclic frequency of 4000 Hz.

The contamination condition of the surface of the laser beam applied six-inch photomask was observed with a laser foreign matter inspection device, with the result that no haze and foreign matter were observed on the test pattern portion but a haze was observed on a glass portion. It was analyzed with a laser Raman spectrophotometer, and was found to be ammonium sulfate. The results obtained by performing the experiments in the same manner were listed in Table 1.

TABLE 1

Distribution of air vents/Effects of counterbore taper angles

| | | The number of air vents | | | | |
|---|---|---|---|---|---|---|
| | Counterbore taper angle | Long side 1 | Long side 2 | Short side 1 | Short side 2 | Production of haze |
| 1 | 60° | 9 | 9 | 7 | 7 | Produced |
| 2 | 90° | 9 | 9 | 7 | 7 | Produced |
| 3 | 95° | 9 | 9 | 7 | 7 | None |
| 4 | 120° | 9 | 9 | 7 | 7 | None |
| 5 | 135° | 9 | 9 | 7 | 7 | None |
| 6 | 135° | 3 | 3 | 3 | 3 | None |
| 7 | 135° | 10 | 10 | 8 | 8 | None |
| 8 | 150° | 9 | 9 | 7 | 7 | None |
| 9 | 175° | 9 | 9 | 7 | 7 | None |
| 10 | 180° | 9 | 9 | 7 | 7 | Produced |
| 11 | 0° | 9 | 9 | 7 | 7 | Produced |
| 12 | 0° | 1 | 0 | 0 | 0 | Produced |
| 13 | 90° | 3 | 3 | 3 | 3 | Produced |

Note:
"0°" in the "Counterbore taper angle" column means that there was no counterbore.

Table 1 shows that, since, in experiment numbers 1, 2, 10, 11 and 13, "the counterbore taper angle" was not appropriate, and, in experiment number 12, the number of "counterbores" itself was insufficient, "the production of a haze" was not avoided.

In addition, various materials that can be used in the present invention will be described.

The dustproof filter used in the present invention is not particularly limited in shape, number and location as long as it can be placed in the portion of the air vent. Examples of the material of the filter include a resin (such as PTFE or Nylon 66), a metal (such as a 316L stainless steal) and a ceramic (such as an alumina or an aluminum nitride). Outside the dustproof filter, a chemical filter for adsorbing and decomposing chemical substances in the atmosphere is preferably provided.

As the pellicle film adhesion adhesive, a conventionally used adhesive can be used. For example, it includes an acrylic resin adhesive, an epoxy resin adhesive, a silicone resin adhesive and a fluorine polymer such as a fluorine contained silicone adhesive; among them, a fluorine polymer is preferable.

Specifically, as a fluorine polymer, a fluorine polymer named "CT69" (the trade name of the product made by "Asahi Glass Co., Ltd.") is taken up as an example.

The reticle adhesion adhesive includes a double-sided adhesion tape, a silicone resin adhesive and an acrylic adhesive.

The pellicle of the present invention can be manufactured in a normal manner by adhering the pellicle film to the upper end surface of the pellicle frame through the pellicle film adhesion adhesive layer, by forming the reticle adhesion adhesive layer on the lower end surface in general, and removably adhering a release layer to the lower end surface of the reticle adhesion adhesive layer.

Here, the pellicle film adhesion adhesive layer formed on the upper end surface of the pellicle frame is diluted in a solvent as required and is applied to the upper end surface of the pellicle frame, followed by heat drying and curing, with the result that it can be formed. In this case, the method of applying the adhesive includes methods using a brush, a spray and an automatic dispenser.

The material of the reticle adhesive protective liner used in the present invention is not particularly limited. For example, it includes PET, PTFE, PFA, PE, PC, polyvinyl chloride and PP.

The invention claimed is:

1. A pellicle for photolithography comprising:
    a frame having side bars, said side bars having a plurality of gas vents passing therethrough to allow gas to communicate through said vents;
    a pellicle membrane provided on the frame; and
    a dustproof filter provided at each outer exit of said vents;
    wherein an outwardly diverging counterbore is formed on the side bars to face outwardly of the frame, said counterbore extending over a plurality of outer exits of said vents.

2. The pellicle for photolithography of claim 1, wherein at least one counterbore is provided on each side bar of the frame.

3. The pellicle for photolithography of claim 1, wherein said counterbore has an angle of divergence which exceeds 90° but is less than 180°.

4. The pellicle for photolithography of claim 1, wherein said counterbore is oval.

5. The pellicle for photolithography of claim 1, wherein said counterbore is rectangular.

6. The pellicle for photolithography of claim 1, wherein each of said side bars includes the gas vents provided close to longitudinal ends and a center thereof.

7. The pellicle for photolithography of claim 6, wherein each of said side bars has the counterbore extending laterally along each of the side bars, said counter bore having a flat bottom portion and side portions extending outwardly from edges of the flat bottom portion at an angle more than 90° and less than 180°.

* * * * *